(12) United States Patent
Birge et al.

(10) Patent No.: US 8,981,546 B2
(45) Date of Patent: Mar. 17, 2015

(54) SEMICONDUCTOR PACKAGE

(75) Inventors: Adam Birge, Beavercreek, OR (US);
Kevin Pickup, Portland, OR (US);
Anthony A. Primavera, Newberg, OR (US)

(73) Assignee: Biotronik SE & Co. KG, Berlin (DE)

( * ) Notice: Subject to any disclaimer, the term of this patent is extended or adjusted under 35 U.S.C. 154(b) by 164 days.

(21) Appl. No.: 13/482,511

(22) Filed: May 29, 2012

(65) Prior Publication Data

US 2012/0319288 A1    Dec. 20, 2012

Related U.S. Application Data

(60) Provisional application No. 61/497,966, filed on Jun. 17, 2011.

(51) Int. Cl.
*H01L 23/02* (2006.01)
*H01L 23/13* (2006.01)
*H01L 23/498* (2006.01)
*H01L 25/065* (2006.01)
*H01L 23/00* (2006.01)

(52) U.S. Cl.
CPC .......... *H01L 23/13* (2013.01); *H01L 23/49805* (2013.01); *H01L 23/49816* (2013.01); *H01L 23/49838* (2013.01); *H01L 25/0657* (2013.01); *H01L 2224/48105* (2013.01); *H01L 2224/49175* (2013.01); *H01L 2225/0651* (2013.01); *H01L 2225/06562* (2013.01); *H01L 2924/15156* (2013.01); *H01L 2924/15311* (2013.01); *H01L 2924/15312* (2013.01); *H01L 2924/15313* (2013.01); *H01L 24/48* (2013.01); *H01L 24/49* (2013.01); *H01L 2224/32145* (2013.01); *H01L 2224/32225* (2013.01); *H01L 2224/48091* (2013.01); *H01L 2224/48227* (2013.01); *H01L 2224/49171* (2013.01); *H01L 2224/73265* (2013.01); *H01L 2225/06596* (2013.01)
USPC ............ 257/686; 257/691; 257/723; 257/784

(58) Field of Classification Search
CPC .............. H01L 23/13; H01L 23/49805; H01L 23/49816; H01L 23/49838
USPC .................................. 257/686, 691, 723, 784
See application file for complete search history.

(56) References Cited

U.S. PATENT DOCUMENTS 5,334,857 A * 8/1994 Mennitt et al. .................. 257/48
2005/0178815 A1* 8/2005 Blood ........................... 228/103

* cited by examiner

*Primary Examiner* — Samuel Gebremariam
(74) *Attorney, Agent, or Firm* — Buchanan Ingersoll & Rooney PC

(57) ABSTRACT

A semiconductor package and a carrier for a semiconductor package are provided, the carrier having a top surface and a bottom surface separated by side walls. The carrier includes a seat for a component, and at least one terminal region for electrically connecting the component to the carrier when mounted to the seat, wherein a test portal is arranged at an outer surface of the carrier, and wherein one or more routing paths are arranged in the carrier for routing one or more electrical contacts arranged at the carrier to the test portal.

20 Claims, 7 Drawing Sheets

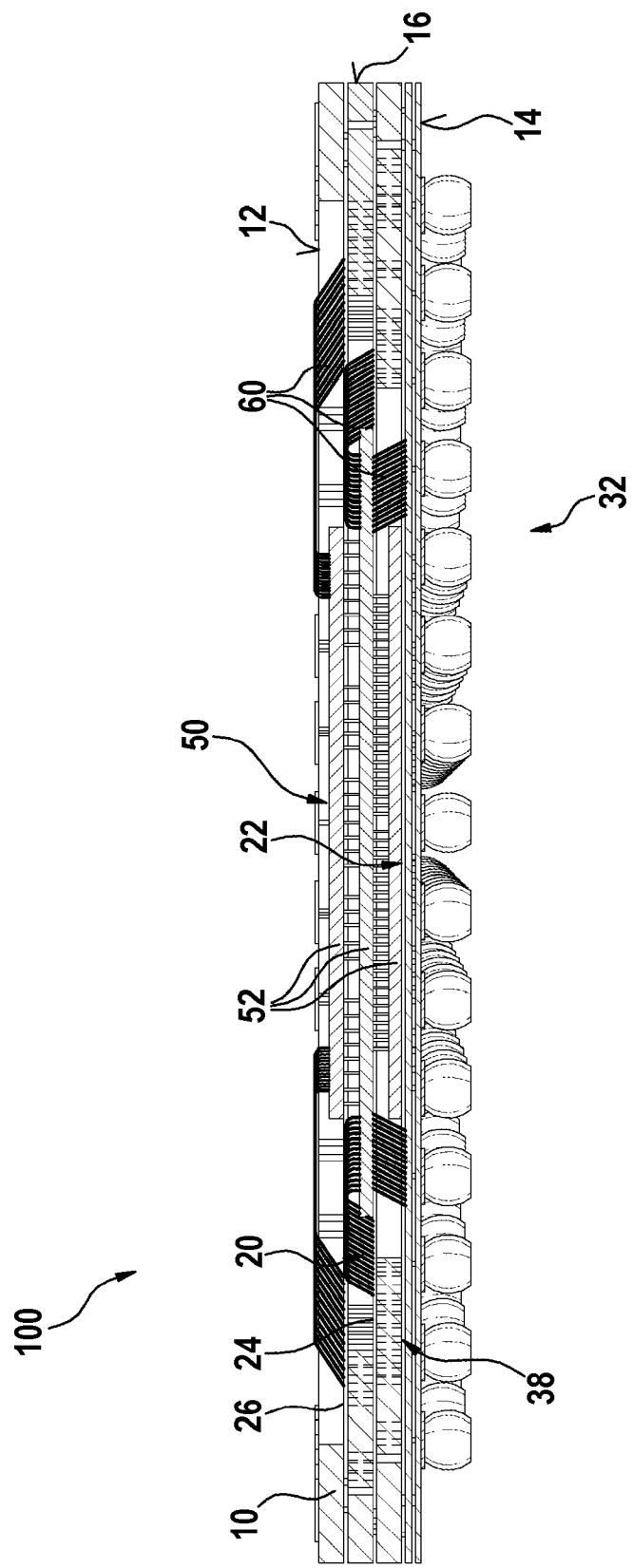

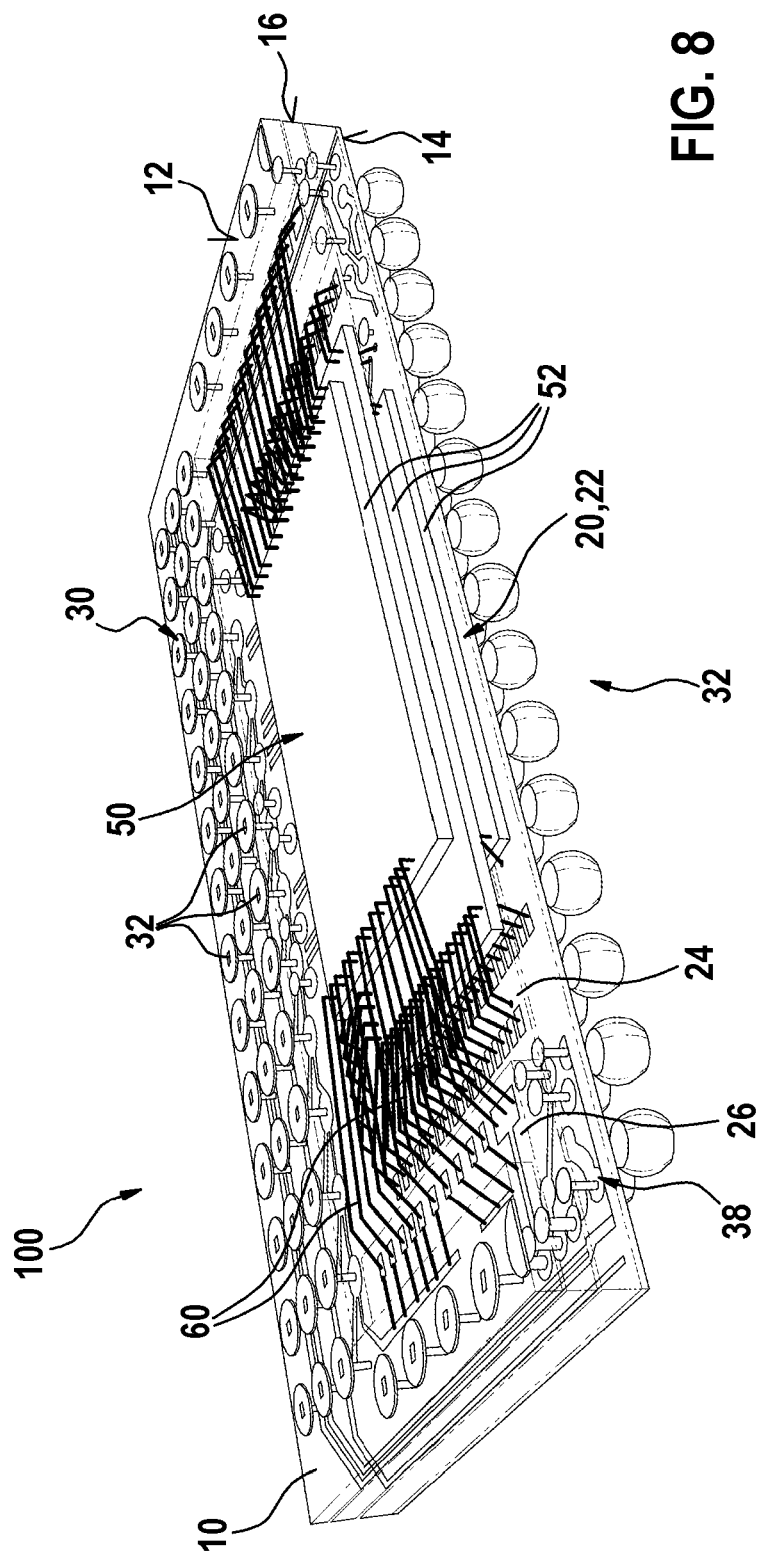

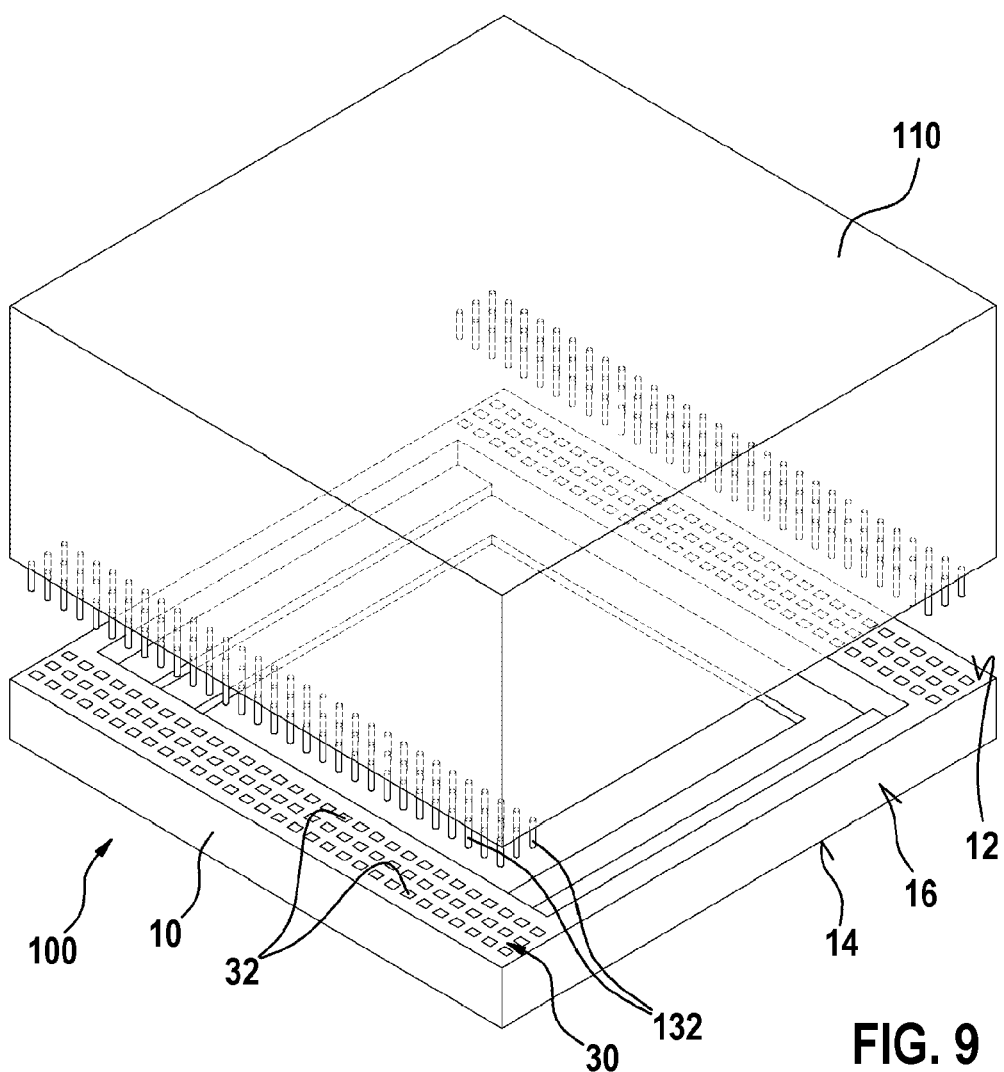

SEMICONDUCTOR PACKAGE

RELATED APPLICATION

This patent application claims the benefit of U.S. Provisional Patent Application No. 61/497,966, filed on Jun. 17, 2011, the disclosure of which is hereby incorporated by reference in its entirety.

TECHNICAL FIELD

The present inventive disclosure relates to a semiconductor device and, more specifically, to a semiconductor package.

BACKGROUND

It is known in the art to provide test points on hybrid electronics modules. In hybrid electronics modules, all test points must be routed to metalized points in one of the module surfaces, which results in a routing effort as well as a high space requirement.

The present invention is directed toward overcoming one or more of the above-identified problems.

It is an object of the present invention to provide a carrier for a semiconductor package with reduced space requirements for routing test points to the semiconductor module.

It is a further object of the present invention to provide a semiconductor package with reduced space requirements for routing test points to the semiconductor module.

The objects are achieved by the features of the independent claim(s). The other claims, the description and the drawing include favorable embodiments of the present invention.

SUMMARY OF THE INVENTION

According a first aspect of the present invention, a carrier for a semiconductor package is proposed, having a top surface and a bottom surface separated by side walls, comprising a seat for a component and at least one terminal region for electrically connecting the component to the carrier when mounted to the seat, wherein a test portal is arranged at an outer surface of the carrier, and wherein one or more routing paths are arranged in the carrier for routing one or more electrical contacts arranged at the carrier to the test portal.

It is of advantage that the present invention allows for a standardized test point methodology. Thus, module-level test systems for both engineering and production uses can be designed for a simplified header/socket model with minimal tooling change between testing different models.

Expediently, the test portal comprises a multitude of test points which can be accessed from outside the carrier and, after assembly of the semiconductor package, from outside the semiconductor package. Advantageously, a standardized test-point solution is made available that reduces board-level routing and space requirements, which retains accessibility of the test points through the assembly process.

The present invention is particularly useful for hybrid electronics modules, such as, for example, semiconductor modules. Typically, a semiconductor package is one of many components placed on the hybrid electronics module. The present invention allows for reducing or eliminating the test points that have to be routed to the electronics module by incorporating the test portal on the semiconductor package.

According to an advantageous embodiment, an outer terminal region may be arranged at the bottom surface and comprising first contacts. The carrier can be used for surface mount technology (SMT). Particularly, one or more first electrical contacts may be arranged in the outer terminal region, wherein at least one first contact may be routed through the carrier to the test portal. More particularly, the outer terminal region may comprise a termination grid array, particularly one of a ball-grid array (BGA), pin-grid array (PGA), column-grid array (CGA), or land-grid array (LGA). Advantageously, the number of the electrical contacts in the grid array solder spheres in the grid ball array can be increased as needed to route test points originating externally from the outer terminal region to the test portal.

According to an advantageous embodiment, the routing paths may be arranged to provide interconnections between the component (when mounted to the seat) and the top and bottom surfaces, as well as between the bottom terminal region and the test portal. A standardized design can be provided for SMT packages.

According to an advantageous embodiment, the test portal may be arranged at the external surface, e.g., at the top surface and/or at one or more side walls. The contacts of the test portal can be easily accessed.

According to an advantageous embodiment, the seat may be arranged in a recess surrounded by the side walls. This allows for sealing the seat when the component is mounted to the carrier, while the test portal can be arranged outside the recess. Optionally, instead of providing a recess in the side walls a selective/partial overmolding of the component can be used as well.

According to an advantageous embodiment, the seat may be arranged to accommodate an electric component comprising two or more electric circuit layers, wherein each layer may be connectable separately to the terminal region. A compact design is possible with high density and complex devices.

According to an advantageous embodiment, the seat may be arranged in a tiered terminal region. Establishing the electrical connections of multi-layered circuit boards in the recess is facilitated. The tiered structure is optional, as in more basic cases only a single semiconductor component may be included.

According to another aspect of the present invention, a semiconductor package is proposed comprising a carrier and an electric component, the carrier having a top surface and a bottom surface separated by side walls, the semiconductor package comprising a seat for a component and at least one terminal region for electrically connecting the electric component to the carrier when mounted to the seat, wherein a test portal is arranged at an outer surface of the carrier, and wherein one or more routing paths are arranged in the carrier for routing one or more electrical contacts arranged at the carrier to the test portal.

It is of advantage that the overall size of the end-use electronic module can shrink, as surface real-estate for test points in the test portal and associated multi-level routing in the electric component can be reduced or eliminated. With a header/socket, the test point density can also be increased. Test points can be aligned on a specific grid pattern so that a "universal" socket could be used for multiple different semiconductor packages.

According to an advantageous embodiment, an outer terminal region may be arranged at the bottom surface and comprising first contacts. Favorably, one or more first electrical contacts are arranged in the outer terminal region, and wherein at least one first contact is routed through the carrier to the test portal. While one or more connections from the outer terminal connection to the test portal may be implemented, this is not an absolute requirement, i.e., there could be embodiments where the test portal is only used to enhance test coverage of the component within the semiconductor package but not of the hybrid module, for example.

According to an advantageous embodiment, the routing paths may be arranged to provide interconnections between the component when mounted to the seat and the top and bottom surfaces, as well as between the bottom terminal region and the test portal.

According to an advantageous embodiment, the test portal may be arranged at an external surface, e.g., at the top surface and/or at the side walls, thus providing easy accessibility for both for both engineering and production uses. Routing for top-side test points also facilitates the addition of additional electronic components such as, for example, decoupling caps on top of or within the BGA package. A decoupling cap is a specific type of small electronic component. However, any electronic component small enough to be mounted within, or on top of, the package could be used without departing from the spirit and scope of the present invention.

According to an advantageous embodiment, the seat may be arranged to accommodate an electric component, which is sealed by a seal to protect the electric component in the carrier, and wherein the seal is arranged in an inner portion of the semiconductor package and the test portal is arranged in an outer portion of the semiconductor package.

Favorably, the present invention provides a termination-grid-array package with top-side accessible test points. Test points may address nodes originating from the contents of the package (i.e., semiconductor die), as well as test points originating from an electronic circuit (module) on which the package is mounted.

Various other objects, aspects and advantages of the present inventive disclosure can be obtained from a study of the specification, the drawings, and the appended claims.

DESCRIPTION OF THE DRAWINGS

The present invention, together with the above-mentioned and other objects and advantages, may best be understood from the following detailed description of the exemplary embodiments, but not restricted to the exemplary embodiments, wherein it is shown in:

FIG. 7 is a side view routing paths of an exemplary embodiment of a carrier with a component wire bonded to the carrier according to the present invention;

FIG. 8 is a perspective, partially cut open top view of routing paths of the carrier of FIG. 7; and FIG. 9 is a perspective, exploded view of a header/socket device.

DETAILED DESCRIPTION

Figure 1:
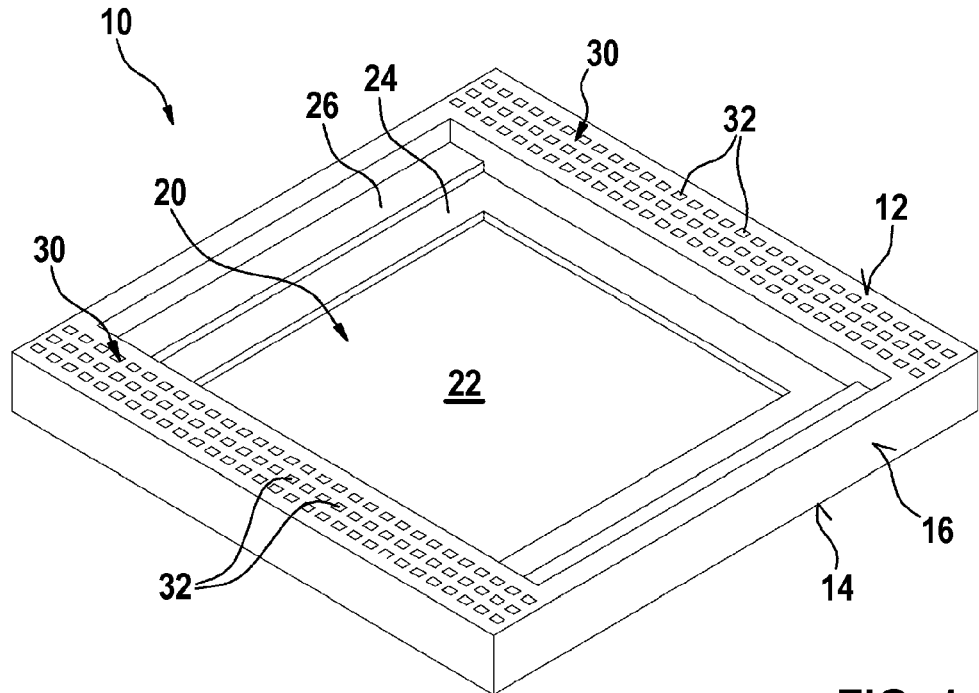
FIG. 1 is an exemplary embodiment of a carrier according to the present invention.

In the drawings, like elements are referred to with equal, or the same, reference numerals. The drawings are merely exemplary schematic representations, and are not intended to portray specific parameters of the present invention. Moreover, the drawings are intended to depict only typical exemplary embodiments of the present invention and, therefore, should not be considered as limiting the scope of the present invention.

FIG. 1 depicts an exemplary embodiment of a carrier 10 according to the present invention. The carrier 10 has a top surface 12 and a bottom surface 14 separated by side walls 16. The carrier 10 is advantageously embodied as a multi-layered printed circuit board assembly comprising a seat 20 for mounting an electric component 50 such as, for example, a semiconductor die.

A first 24 and a second 26 terminal region for electrically connecting the component 50 to the carrier 10 are arranged in a recess 22, which includes the seat 20. The first and second terminal regions 24 and 26 are tiered, for example like steps, leading from the seat 20 to the upper surface 12.

A test portal 30 is arranged at the outer surfaces of the carrier 10, e.g., at the top surface 12 and at the side walls 16. Multiple routing paths (see reference number 38 in FIGS. 7 and 8) are arranged in the carrier 10 for routing one or more electrical contacts arranged at the carrier 10 to the test portal 30. The test portal 30 is arranged on the top surface 12 of the carrier 10 on two sides of the recess 22 and comprises a multitude of contacts 32, for instance, metal plated pads.

Figure 2A:
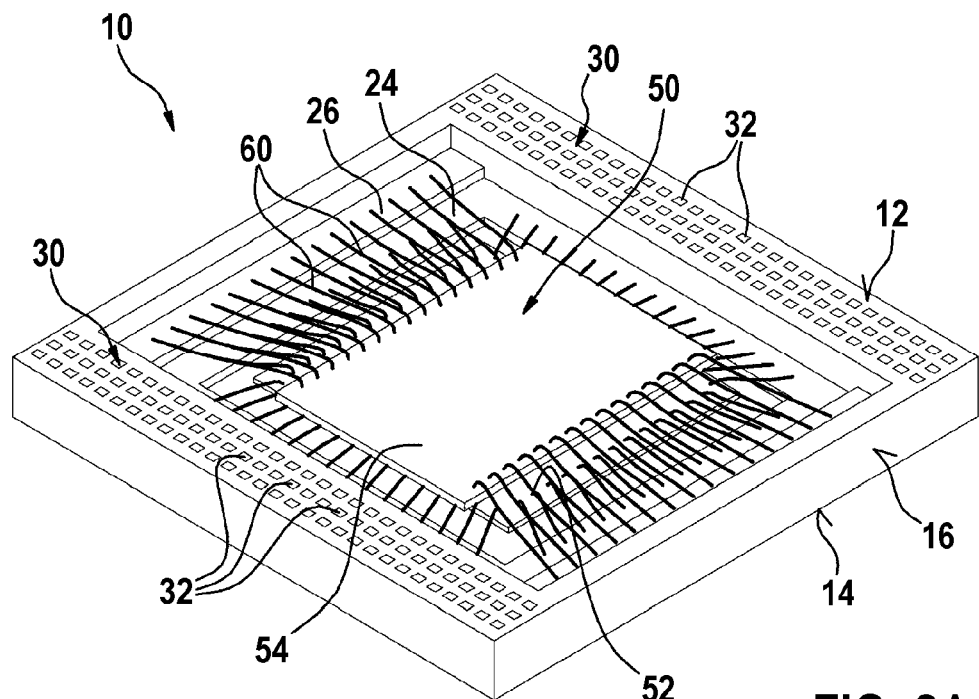
FIG. 2A is a component wire bonded to the carrier of FIG. 1 with a test portal at the top surface.
Figure 2B:
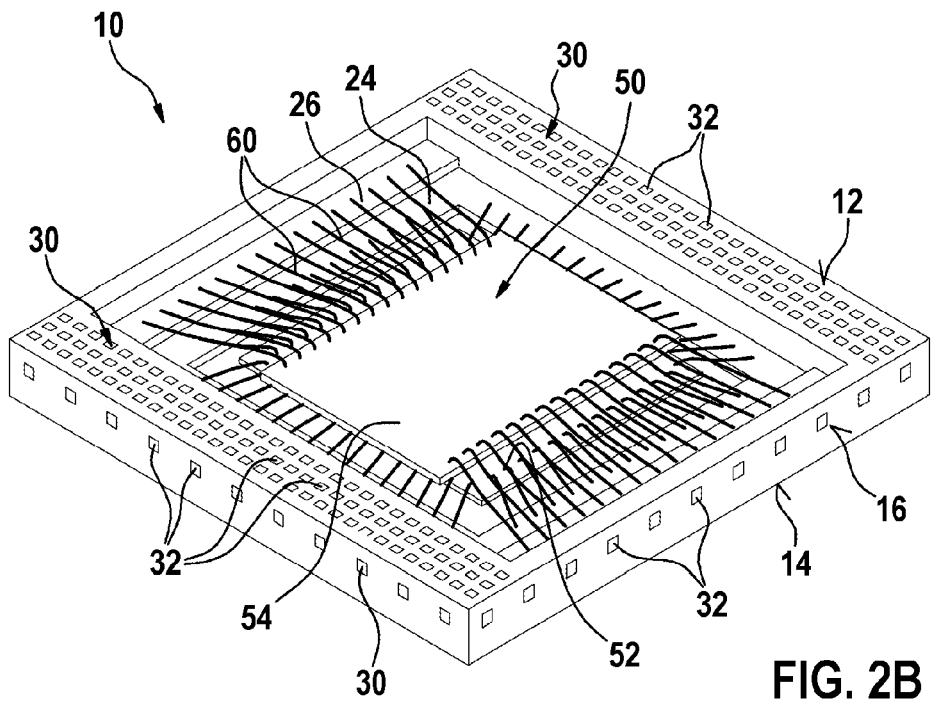
FIG. 2B is a component wire bonded to the carrier of FIG. 1 with a test portal at the top surface and the side walls.

FIG. 2A depicts a component 50 wire bonded with wires 60 to the carrier of FIG. 1. The test portal 30 is arranged at two opposing sides of the top surface 12. FIG. 2B shows an arrangement where the test portal 30 is arranged at two opposing sides of the top surface 12 and at all side walls 16. The component 50 may, for instance, comprise three semiconductor dies 52 which are wire bonded to the respective terminals in the first and second terminal regions 24 and 26. The tiered arrangement of the first and second terminal regions 24 and 26 allows for bonding the die in different heights in the recess 22.

Figure 3:
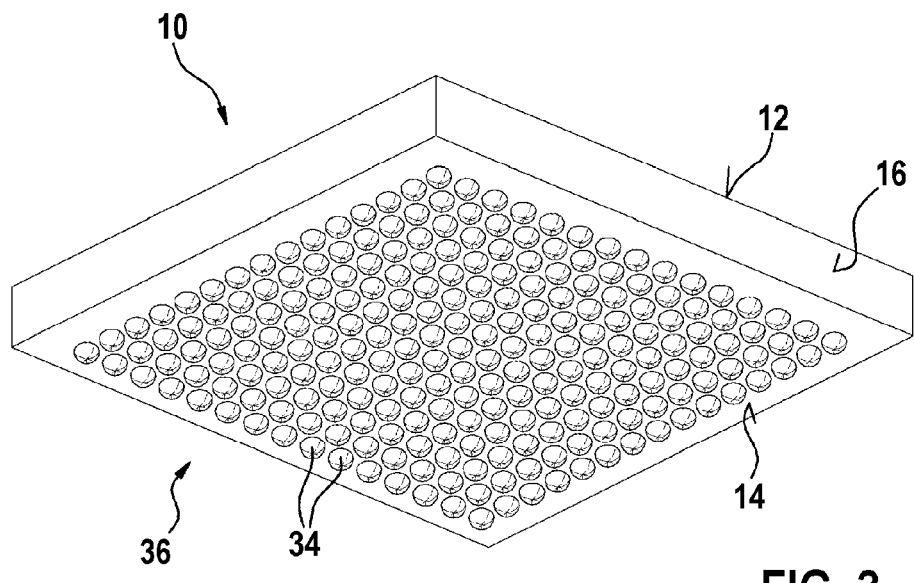
FIG. 3 is a bottom view the carrier of FIG. 1.

FIG. 3 shows a bottom view the carrier of FIG. 1, displaying an outer terminal region 36 arranged at the bottom surface 14 of the carrier 10. The outer terminal region 36 comprises first electrical contacts 34, wherein one or more of the first contacts 34 are routed through the carrier 10 to the contacts 32 of the test portal 30. The outer terminal region 36 can be embodied as a termination-grid array, by way of example, as a ball grid array. A ball grid array (BGA) is a package of an integrated circuit with the bottom of the package covered, or partly covered, with solder balls or spheres in a grid pattern. The solder spheres conduct electrical signals from the integrated circuit of a printed circuit board (PCB). These solder spheres can be placed manually or with automated equipment, and are held in place with a flux until soldering occurs. The device is placed on a PCB with terminal pads in a pattern that matches the array of solder spheres. The assembly is then heated, e.g., in a reflow oven or by an infrared heater, causing the solder spheres to melt. Surface tension causes the molten solder to hold the package in alignment with the PCB, at the correct separation distance, while the solder cools and solidifies.

The BGA allows for surface mount technology assembly of the carrier 10. The top-side space of the BGA package is used as a standardized test portal 30 for both the component-level and end-use electronic modules. An existing BGA bump I/O count (i.e., the number of the solder spheres 34) may be expanded as needed to route test points originating externally from the BGA to the top side 12 of the package.

It should be understood that while a BGA is shown in FIG. 3, other termination grid arrays such as, for example, a pin-grid array (PGA), a column-grid array (CGA), and a land-grid array (LGA), may be implemented without departing from the spirit and scope of the present invention.

Figure 4:
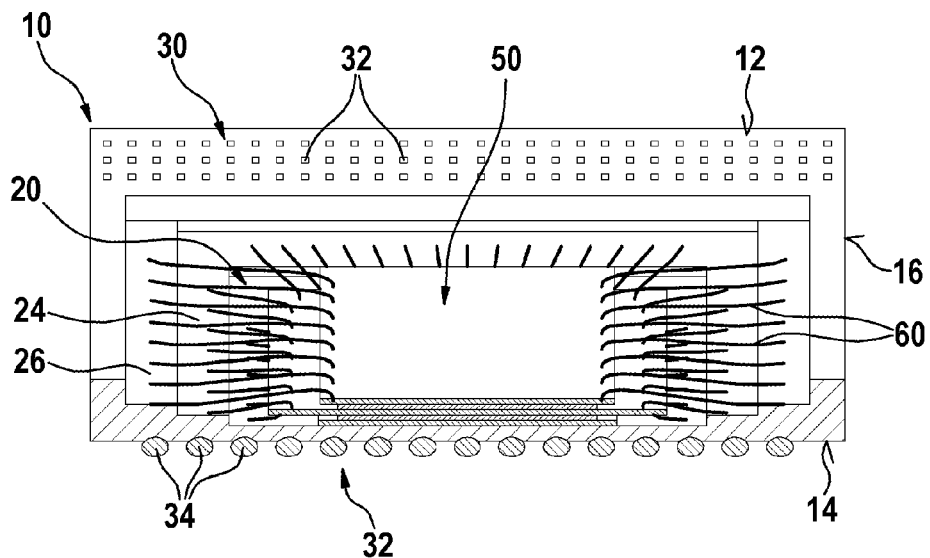
FIG. 4 is a combined side and top view of the exemplary embodiment of FIG. 2A.

FIG. 4 illustrates a combined side view (in the lower part of the Figure) and top view (in the upper part of the Figure) of the exemplary embodiment of FIG. 2 showing in detail the compactness of the arrangement. The contacts 32 of the test portal 30 are easily accessible on the top surface 12 of the carrier.

Figure 5:
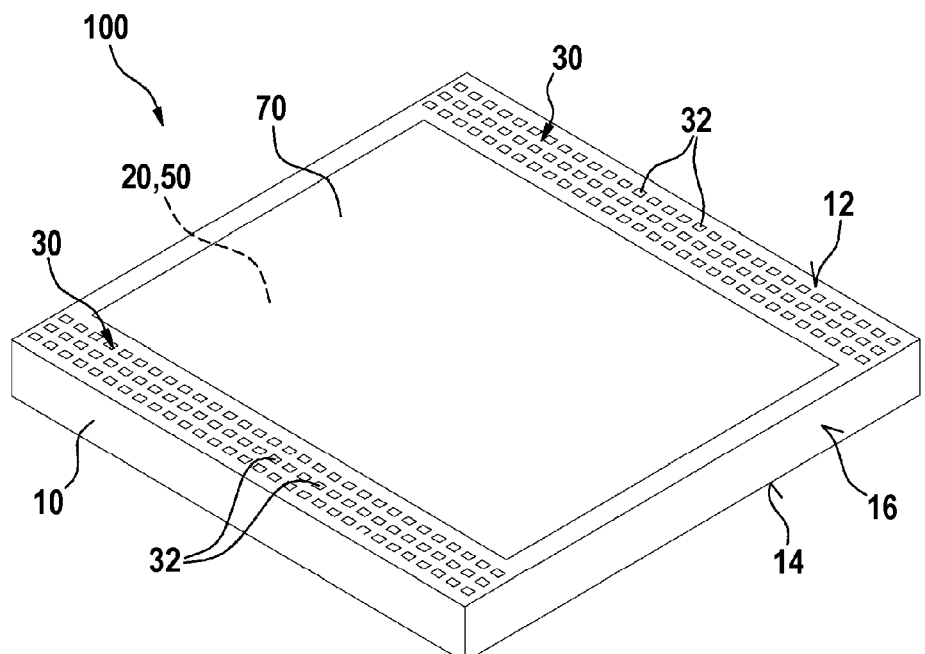
FIG. 5 is an exemplary embodiment of a semiconductor package comprising a carrier according to the present invention.

FIG. 5 displays an exemplary embodiment of a semiconductor package 100 comprising a carrier 10 according to the present invention. The component 50 is covered by a seal 70, for instance, a mold molded over the recess 22. The contacts 32 of the test portal 30 are still fully accessible after overmolding the component 50.

Figure 6:
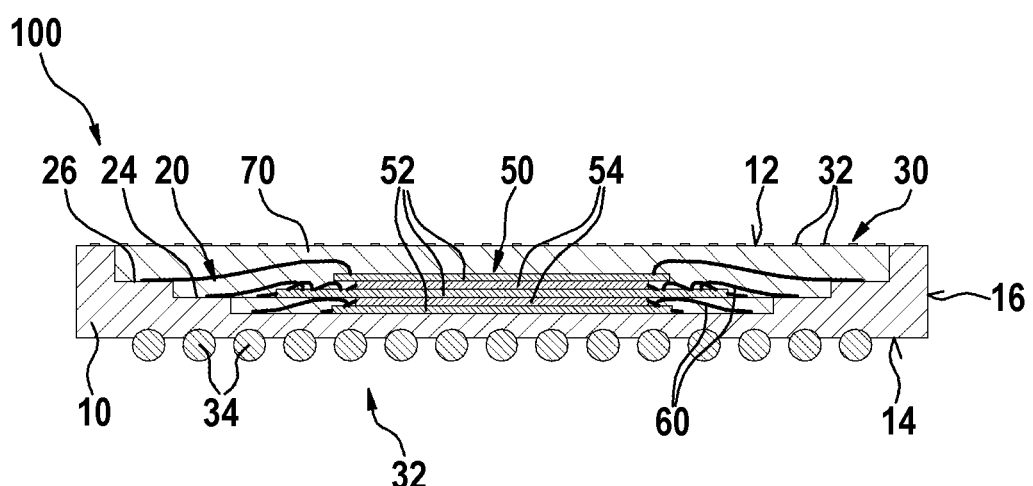
FIG. 6 is a side cut view the semiconductor package of FIG. 5.

FIG. 6 shows in a side cut view the semiconductor package 100 of FIG. 5. The component 50 arranged on the seat 20 in the recess 22 comprises three stacked semiconductor dies 52 separated by spacers 54.

The semiconductor package 100 is assembled by mounting the BGA internals, such as semiconductor die 52, passive components (not shown) and the like, within the recess 22 formed by the multi-layered printed circuit board (PCB) assembly (carrier 10). Both the top and bottom surfaces 12 and 14 of the carrier 10 have metalized pads (contacts 32, 34), with one side (bottom surface 14) being bumped for surface mount technology (SMT) assembly with solder spheres 34. PCB routing with routing paths 38 (see FIGS. 7-8) allow interconnections between the BGA internals and either the top 12 or bottom 14 surface, as well as between the top and bottom surfaces 12 and 14.

FIGS. 7-8 depict in different views the metallic interconnects or routing paths 38 which are arranged to provide interconnections between the component 50 mounted to the seat 20 and the top and bottom surfaces 12, 14 as well as between the bottom terminal region 36 and the contacts 32 of the test portal 30. The routing paths 38 are arranged in the carrier 10, particularly in the bottom as well as the side walls 16.

FIG. 9 illustrates an exemplary embodiment of a semiconductor package 100 in the form of a header/socket device, wherein a header 110 cooperates with a socket which provides the test portal 30. The header 110 has a multitude of pins 132 at the interface facing the contacts 32 of the test portal 30, so that the pins 132 can establish an electrical contact between the pins 132 and the contacts 32 of the test portal 30.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range.

We claim:

1. A carrier for a semiconductor package, having a top surface and a bottom surface separated by side walls, the carrier comprising:
   a seat for a component; and
   at least one terminal region for electrically connecting the component to the carrier when mounted to the seat, wherein a test portal is arranged at an outer surface of the carrier, and wherein one or more routing paths are arranged within the carrier, such that the one or more routing paths are within an interior region formed by the top surface, bottom surface and side walls, for routing one or more electrical contacts arranged at the carrier to the test portal.

2. The carrier according to claim 1, wherein an outer terminal region comprising first contacts is arranged at the bottom surface.

3. The carrier according to claim 2, wherein the outer terminal region comprises a termination-grid array.

4. The carrier according to claim 3, wherein the termination-grid array comprises a ball-grid array (BGA), a pin-grid array (PGA), a column-grid array (CGA), or a land-grid array (LGA).

5. The carrier according to claim 3, wherein one or more first electrical contacts are arranged in the outer terminal region.

6. The carrier according to claim 5, wherein at least one first contact is routed through the carrier to the test portal.

7. The carrier according to claim 1, wherein the one or more routing paths are arranged to provide interconnections between the component when mounted to the seat and the top and bottom surfaces, as well as between the bottom terminal region and the test portal.

8. The carrier according to claim 1, wherein the test portal is arranged at an external surface.

9. The carrier according to claim 1, wherein the seat is arranged in a recess surrounded by the side walls.

10. The carrier according to claim 1, wherein the seat is arranged to accommodate an electric component comprising two or more electric circuit layers, wherein each layer is connectable separately to the terminal region.

11. The carrier according to claim 1, wherein the seat is arranged in a tiered terminal region.

12. The carrier according to claim 1, wherein the test portal is arranged on the top surface and the side walls of the carrier.

13. A semiconductor package comprising:
   a carrier, the carrier having a top surface and a bottom surface separated by side walls, the carrier comprising:
      a seat for a component; and
      at least one terminal region for electrically connecting the component to the carrier when mounted to the seat, wherein a test portal is arranged at an outer surface of the carrier, and wherein one or more routing paths are arranged within the carrier, such that the one or more routing paths are within an interior region formed by the top surface, bottom surface and side walls, for routing one or more electrical contacts arranged at the carrier to the test portal.

14. The semiconductor package according to claim 13, wherein an outer terminal region comprising first contacts is arranged at the bottom surface.

15. The semiconductor package according to claim 14, wherein one or more first electrical contacts are arranged in the outer terminal region, and wherein at least one first contact is routed through the carrier to the test portal.

16. The semiconductor package according to claim 14, wherein the outer terminal region comprises a termination-grid array.

17. The semiconductor package according to claim 16, wherein the termination-grid array comprises a ball-grid array (BGA), a pin-grid array (PGA), a column-grid array (CGA), or a land-grid array (LGA).

18. The semiconductor package according to claim 13, wherein the one or more routing paths are arranged to provide interconnections between the component when mounted to the seat and the top and bottom surfaces, as well as between the bottom terminal region and the test portal.

19. The semiconductor package according to claim 13, wherein the test portal is arranged at an external surface.

20. The semiconductor package according to claim 13, wherein the seat is component in the carrier, and wherein the seal is arranged in an inner portion of the arranged to accommodate an electric component, which is sealed by a seal to protect the electric semiconductor package and the test portal is arranged in an outer portion of the semiconductor package.

* * * * *